US007934945B2

(12) United States Patent
Narita et al.

(10) Patent No.: US 7,934,945 B2
(45) Date of Patent: May 3, 2011

(54) ELECTRICAL CONNECTING APPARATUS

(75) Inventors: Hisao Narita, Aomori (JP); Nobuyuki Yamaguchi, Aomori (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 0 days.

(21) Appl. No.: 12/443,462

(22) PCT Filed: Aug. 6, 2007

(86) PCT No.: PCT/JP2007/065787
§ 371 (c)(1),
(2), (4) Date: Dec. 2, 2009

(87) PCT Pub. No.: WO2008/038468
PCT Pub. Date: Apr. 3, 2008

(65) Prior Publication Data
US 2010/0105224 A1    Apr. 29, 2010

(30) Foreign Application Priority Data

Sep. 28, 2006    (JP) ................................. 2006-263811

(51) Int. Cl.
*G01R 31/02*    (2006.01)
(52) U.S. Cl. ........ 439/482; 324/758; 324/754; 324/756; 324/762
(58) Field of Classification Search .................. 439/482, 439/758, 754, 756, 762; 324/758, 754, 756, 324/762
See application file for complete search history.

(56) References Cited

U.S. PATENT DOCUMENTS

| 4,081,601 | A |   | 3/1978  | Dinella et al. |
|-----------|---|---|---------|----------------|
| 5,136,470 | A |   | 8/1992  | Sheridon et al. |
| 5,264,787 | A | * | 11/1993 | Woith et al. ................... 324/758 |
| 5,461,326 | A | * | 10/1995 | Woith et al. ................... 324/758 |
| 5,468,917 | A |   | 11/1995 | Brodsky et al. |
| 5,623,213 | A |   | 4/1997  | Liu et al. |
| 5,703,331 | A |   | 12/1997 | Brodsky et al. |
| 5,729,896 | A |   | 3/1998  | Dalal et al. |
| 6,041,495 | A |   | 3/2000  | Yoon et al. |
| 6,122,815 | A |   | 9/2000  | Kownacki et al. |

(Continued)

FOREIGN PATENT DOCUMENTS

JP    08-327658    12/1996

(Continued)

OTHER PUBLICATIONS

International Search Report for International Patent Application Serial No. PCT/JP2007/056751; Japanese Patent Office, Jun. 26, 2007.

(Continued)

*Primary Examiner* — Gary F. Paumen
(74) *Attorney, Agent, or Firm* — Bryan A. Santarelli; Graybeal Jackson LLP

(57) ABSTRACT

An embodiment of an electrical connecting apparatus comprises a support board, a plate spring arranged on the support board, an attachment device attaching the plate spring to the support board, a block having an attachment surface directing downward, and a flexible circuit board in which a plurality of contactors are arranged. As for the block, the attachment surface for attaching the circuit board is protruded further to the lower side than the support board. The plate spring receives initial load to bring a state where at least a center area for attaching the block is biased toward the upper side. Thus, a good electrical contacting state can be obtained without increasing the overdriving amount.

9 Claims, 14 Drawing Sheets

U.S. PATENT DOCUMENTS

| | | |
|---|---|---|
| 6,906,414 B2 | 6/2005 | Zhao et al. |
| 7,167,373 B1 | 1/2007 | Hoang et al. |
| 7,323,093 B2 | 1/2008 | Naito et al. |
| 7,342,402 B2 * | 3/2008 | Kim et al. .................. 324/758 |
| 7,416,759 B2 | 8/2008 | Shintate et al. |
| 7,471,095 B2 * | 12/2008 | Narita et al. ................ 324/754 |
| 7,487,587 B2 | 2/2009 | Vanfleteren et al. |
| 7,800,001 B2 | 9/2010 | Hamada et al. |
| 2001/0013423 A1 | 8/2001 | Dalal et al. |
| 2002/0001056 A1 | 1/2002 | Sandberg et al. |
| 2004/0212051 A1 | 10/2004 | Zhao et al. |
| 2006/0231288 A1 | 10/2006 | Vanfleteren et al. |
| 2010/0029099 A1 | 2/2010 | Hamada et al. |

FOREIGN PATENT DOCUMENTS

| | | |
|---|---|---|
| JP | 10-505162 | 5/1998 |
| JP | 11-044708 | 2/1999 |
| JP | 2000-150594 | 5/2000 |
| JP | 2001-147240 | 5/2001 |
| JP | 2002-509604 | 3/2002 |
| JP | 2002-311049 | 10/2002 |
| JP | 2002-340932 | 11/2002 |
| JP | 2002-365310 | 12/2002 |
| JP | 2003-043064 | 2/2003 |
| JP | 2003-121469 | 4/2003 |
| JP | 2003-227849 | 8/2003 |
| JP | 2005-038983 | 2/2005 |
| WO | 9607924 | 3/1996 |
| WO | 9743653 | 11/1997 |
| WO | 2007119636 | 3/2007 |
| WO | 2007116795 | 10/2007 |
| WO | 2007119637 | 10/2007 |
| WO | 2007119638 | 10/2007 |

OTHER PUBLICATIONS

International Search Report for International Patent Application Serial No. PCT/JP2007/057358; Japanese Patent Office, Jun. 12, 2007.

International Search Report for International Patent Application Serial No. PCT/JP2007/057359; Japanese Patent Office, Jun. 26, 2007.

International Search Report for International Patent Application Serial No. PCT/JP2007/057362; Japanese Patent Office, Jun. 12, 2007.

International Search Report for International Patent Application Serial No. PCT/JP2007/065787; Japanese Patent Office, Oct. 30, 2007.

* cited by examiner

ELECTRICAL CONNECTING APPARATUS

PRIORITY CLAIM

The present application is a United States national phase application filed pursuant to 35 USC §371 of International Patent Application Serial No. PCT/JP2007/065787, entitled ELECTRICAL CONNECTING DEVICE, filed Aug. 6, 2007; which application claims priority to Japanese Patent Application Serial No. 2006-263811, filed Sep. 28, 2006; which foregoing applications are incorporated herein by reference in their entireties.

CROSS REFERENCE TO RELATED APPLICATIONS

This application is related to U.S. patent application Ser. No. 12/296,430 entitled ELECTRICAL CONNECTING APPARATUS, filed Oct. 7, 2008, and U.S. application Ser. No. 12/297,214 entitled FLEXIBLE WIRING BOARD AND ELECTRICAL CONNECTING APPARATUS, filed Oct. 14, 2008 and application Ser. No. 12/297,215 entitled PROBE SHEET AND ELECTRICAL CONNECTING APPARATUS, filed Oct. 14, 2008 and application Ser. No. 12/297,216 entitled METHOD FOR MANUFACTURING PROBE SHEET, filed Oct. 14, 2008 and which are incorporated herein by reference in their entireties.

TECHNICAL FIELD

An embodiment of the present invention relates to an electrical connecting apparatus for use in an electrical test of a flat-plate-shaped device under test such as an integrated circuit or a board for a display.

BACKGROUND

A flat-plate-shaped device under test such as an integrated circuit or a display board undergoes an electrical test with use of an electrical connecting apparatus such as a probe card. In the electrical test, the device under test is thrust by contactors of the electrical connecting apparatus at its electrodes and is powered in such a state.

As one of the electrical connecting apparatuses of this kind, there is an art of using a flexible circuit board having a flexible sheet-like member such as an FPC in which a flexible electrical insulating sheet is provided with a plurality of wires, and a plurality of contactors soldered to the respective wires of this sheet-like member (Patent Document 1).

Patent Document 1: Japanese Unexamined Patent Publication No. 2002-311049, which is incorporated by reference.

In the above conventional art, each contactor comprises a pedestal portion coupled with the wire at one end portion, an arm portion extending from the other end of the pedestal portion in the longitudinal direction of the wire, and a probe tip portion protruded from the tip end of the arm portion to a side opposite the pedestal portion. The arm portion and the probe tip portion act as a main body portion that is elastically deformed substantially at the arm portion when the tip end of the probe tip portion, that is, the probe tip, is thrust to an electrode of a device under test.

The circuit board using such contactors is attached to a support board such as a wiring board by an attachment device so that the probe tip portions can be directed to the device under test, thus to be assembled into an electrical connecting apparatus.

The attachment device comprises a plate-shaped member arranged on the upper surface of the support board, a ring-shaped member arranged in a step portion directing downward provided at the center of the support board so as to be located at the step portion, a plate spring screwed on the lower side of the ring-shaped member, and a block having at least an attachment surface on the lower side, located on the lower side of the plate spring in a state where the attachment surface is protruded in the downward direction of the support board, and screwed in the ring-shaped member.

The plate-shaped member is attached to the support board by a plurality of attachment screws penetrating the plate-shaped member and the support board in the up-down direction and screwed in the ring-shaped member and attaches the ring-shaped member to the support board. The plate spring is kept in parallel with the support board.

The aforementioned circuit board is bonded to the attachment surface of the block at a contactor area at which the contactors are arranged and is attached to the lower surface of the support board by a ring-shaped spring holder and a plurality of locking screws at an outermost circumferential portion of an outer area surrounding this contactor area.

After the above electrical connecting apparatus is attached to a testing apparatus such as a prober, the probe tip of each contactor is thrust to the electrode of the device under test so that predetermined probe pressure acts on the electrode and the probe tip, and a desired contactor is powered in a state where predetermined overdriving acts on each contactor. By doing so, an electrical test is conducted.

When an imaginal probe tip surface formed by all the probe tips is inclined to the support board or the testing apparatus (device under test), the arm portion of each contactor and the plate spring are elastically deformed since the probe tip is thrust to the device under test. Accordingly, the contactor area and the probe tip surface are automatically compensated to be parallel to the support board.

However, in the conventional electrical connecting apparatus, since the plate spring is kept in parallel with the support board in a state where the probe tip of each contactor is not thrust to the electrode of the device under test, the probe pressure and the overdriving amount are proportional to each other.

Thus, in the conventional electrical connecting apparatus, the damage given to the contactor and the electrode increases when the overdriving amount is large, while the probe pressure may be too small to obtain a good electrical contacting state between the probe tip and the electrode when the overdriving amount is small.

SUMMARY

An embodiment of the present invention obtains a good electrical contacting state without increasing the overdriving amount.

An electrical connecting apparatus according to an embodiment of the present invention comprises a support board having an upper surface and a lower surface, a plate spring arranged on the support board, an attachment device for attaching the plate spring to the support board, a block having an attachment surface directed downward and attached to the lower side of the plate spring in a state where at least the attachment surface is protruded further to the lower side than the support board, and a flexible circuit board having a contactor area in which a plurality of contactors are arranged and an outside area around the contactor area and attached at part of the outside area to the lower surface of the support board in a state where at least the contactor area is opposed to the attachment surface of the block.

The plate spring has a center area to which the block is attached, and receives initial load to bring a state where at least the center area is biased toward the upper side of the support board.

The plate spring may further have a plurality of extending areas integrally continuing to the center area and extending from the center area in the radial direction of an imaginal circle to be spaced in the circumferential direction of the imaginal circle, and a circumferential area integrally continuing around the extending areas and supported to the attachment device.

The attachment device may have a ring-shaped member arranged on the support board so that at least its part is opposed to part of the plate spring, and a spring holder attached to the ring-shaped member so as to sandwich part of the plate spring in collaboration with the ring-shaped member.

The spring holder may have an annular portion screwed on the ring-shaped member so as to sandwich a part of the plate spring in collaboration with the ring-shaped member and an inward flange portion extending from the lower end portion of the annular portion to the center side of the annular portion, and the block may have a lower block portion having the attachment surface, an upper block portion protruded upward from the lower block portion and attached to the plate spring, and an outward flange portion extending outward in the radial direction from the upper block portion and located on the upper side of the inward flange portion.

The distance dimension from the upper end of the annular portion to the upper end of the inward flange portion may be shorter than the distance dimension from the upper end of the upper block portion to the lower end of the outward flange portion.

The attachment device may further have an attachment plate attached to the upper side of the upper block portion via the plate spring so as to sandwich the center area of the plate spring in collaboration with the upper block portion.

The support board may have a through hole at the center, and the plate spring may be attached to the support board so as to be located within the through hole or to be opposed to the through hole.

The attachment device may further have a plate-shaped member attached to the upper side of the support board so as to close the through hole, and the ring-shaped member may be attached to the lower side of the plate-shaped member.

The electrical connecting apparatus may further comprise a thrusting ring for attaching the outside area of the circuit board to the lower surface of the support board.

The spring constant of the plate spring may be smaller than the total sum of the spring constant of the contactors.

According to an embodiment of the present invention, since the plate spring receives initial load to bring a state where at least the center area is biased toward the upper surface side of the support board, the probe pressure acting on the probe tip of each contactor and the electrode of the device under test comes under the influence of not only reactive force by elastic deformation of the contactor and the plate spring when the probe tip is thrust to the electrode of the device under test but also reactive force based on elastic deformation of the plate spring by the initial load. Thus, according to an embodiment of the present invention, a good electrical contacting state can be obtained without increasing the overdriving amount.

In a case where the plate spring further has a plurality of extending areas integrally continuing to the center area and extending from the center area in the radial direction of an imaginal circle to be spaced in the circumferential direction of the imaginal circle and a circumferential area integrally continuing around the extending areas and supported to the attachment device, the plate spring is elastically deformed at the extending areas reliably when the probe tips are thrust to the electrodes, and thus irregular flexure of the plate spring is prevented reliably.

In a case where the spring holder has an inward flange portion extending from the lower end portion of an annular portion to the center side of the annular portion screwed on the ring-shaped member so as to sandwich part of the plate spring in collaboration with the ring-shaped member, where the block has an outward flange portion extending outward in the radial direction from an upper block portion protruded upward from its lower block portion and attached to the plate spring, and where the outward flange portion of the block is located on the upper side of the inward flange portion of the spring holder, the plate spring can receive the initial load reliably without preventing displacement of the block in the up-down direction when the probe tips are thrust to the electrodes.

In a case where the distance dimension from the upper end of the annular portion to the upper end of the inward flange portion of the spring holder is shorter than the distance dimension from the upper end of the upper block portion to the lower end of the outward flange portion of the block, the plate spring is kept in a state of receiving the initial load reliably.

In a case where the attachment device further has an attachment plate attached to the upper side of the upper block portion via the plate spring so as to sandwich the center area of the plate spring in collaboration with the upper block portion, the block is attached to the plate spring reliably.

In a case where the attachment device further has a plate-shaped member attached to the upper side of the support board so as to close the through hole, and where the ring-shaped member is attached to the lower side of the plate-shaped member, the plate spring is supported on the support board in a stable state.

In a case where the electrical connecting apparatus further comprises a thrusting ring for attaching the outside area of the circuit board to the lower surface of the support board, the circuit board is supported on the support board at its outside area.

In a case where the spring constant of the plate spring is smaller than the total sum of the spring constant of all the contactors, when the overdriving acts on the contactors, only the contactors are elastically deformed until the overdriving amount is one in which the initial load by the preload acting on the plate spring and the total sum of the spring constant of all the contactors are at equilibrium, and thereafter the plate spring is elastically deformed mainly although the contactors are also elastically deformed. Thus, the probe pressure increases significantly in reaction to the overdriving in a state where only the contactors are elastically deformed (in a state of the initial load) and thereafter increases moderately. Consequently, variation of the probe pressure by the overdriving is small, and stable electrical contact can be obtained.

DESCRIPTION OF THE SYMBOLS

Figure 1:
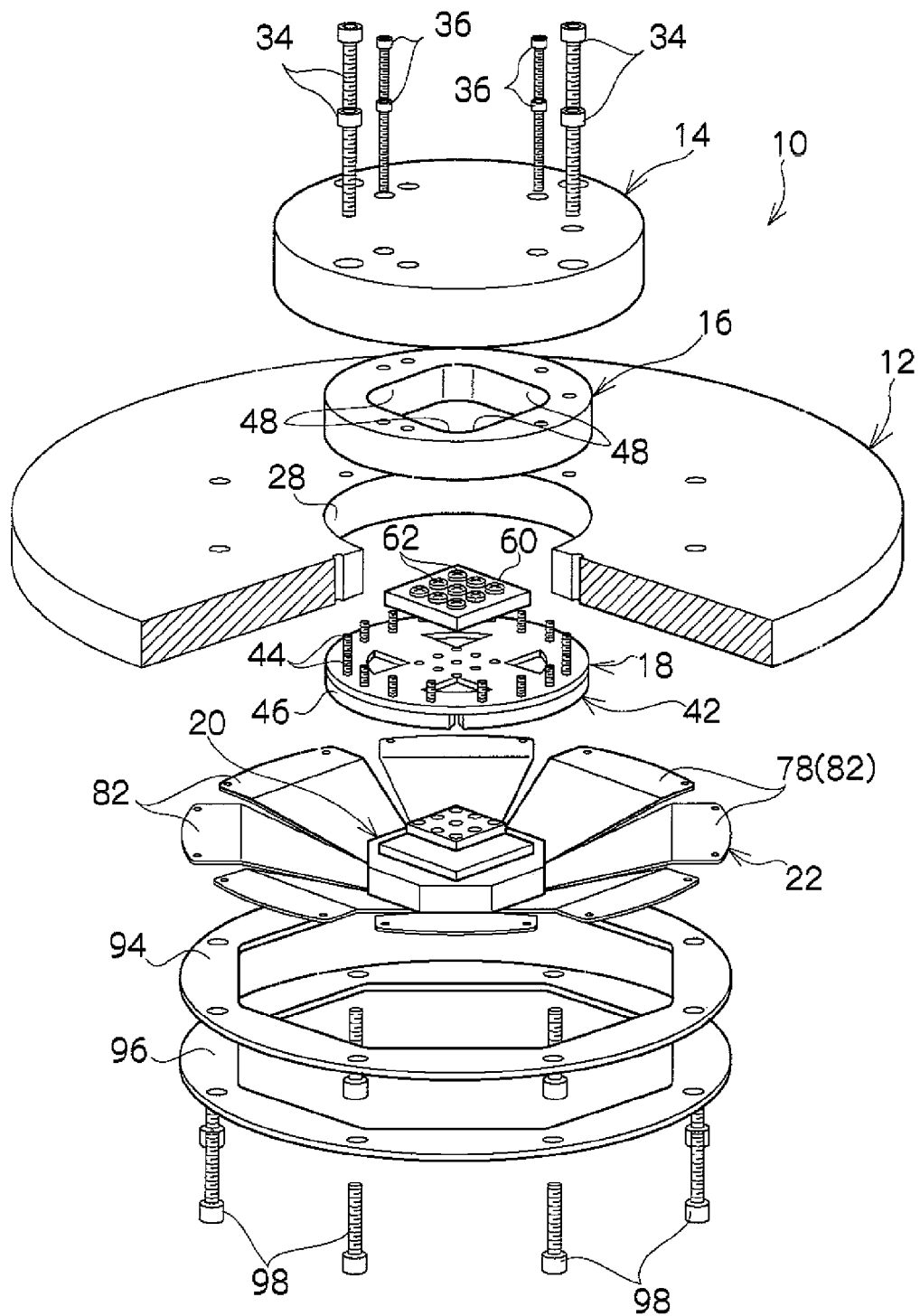
FIG. 1 is an exploded perspective view showing an embodiment of an electrical connecting apparatus according to an embodiment of the present invention.
Figure 2:
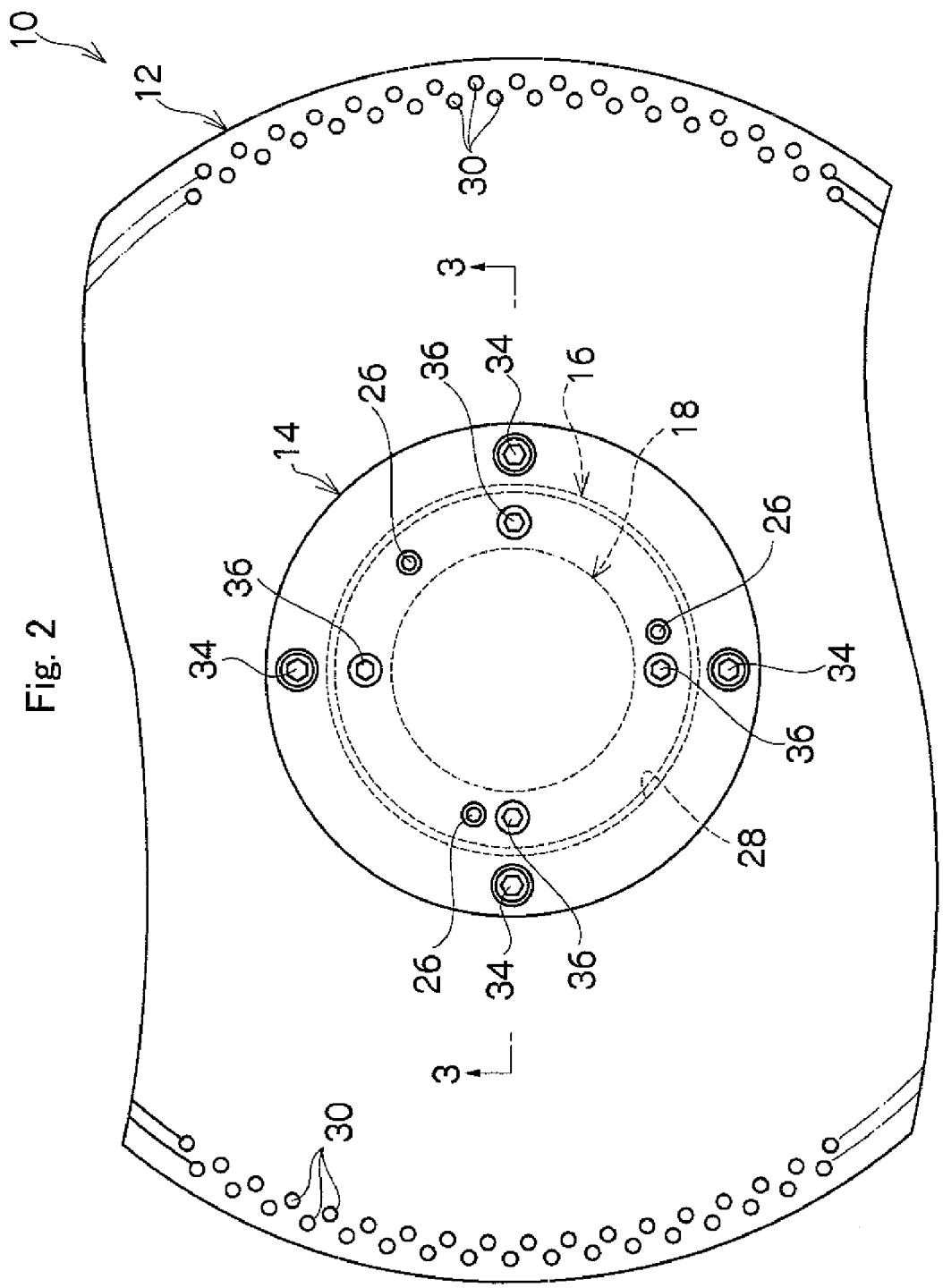
FIG. 2 is a plan view of the electrical connecting apparatus shown in FIG. 1.
Figure 3:
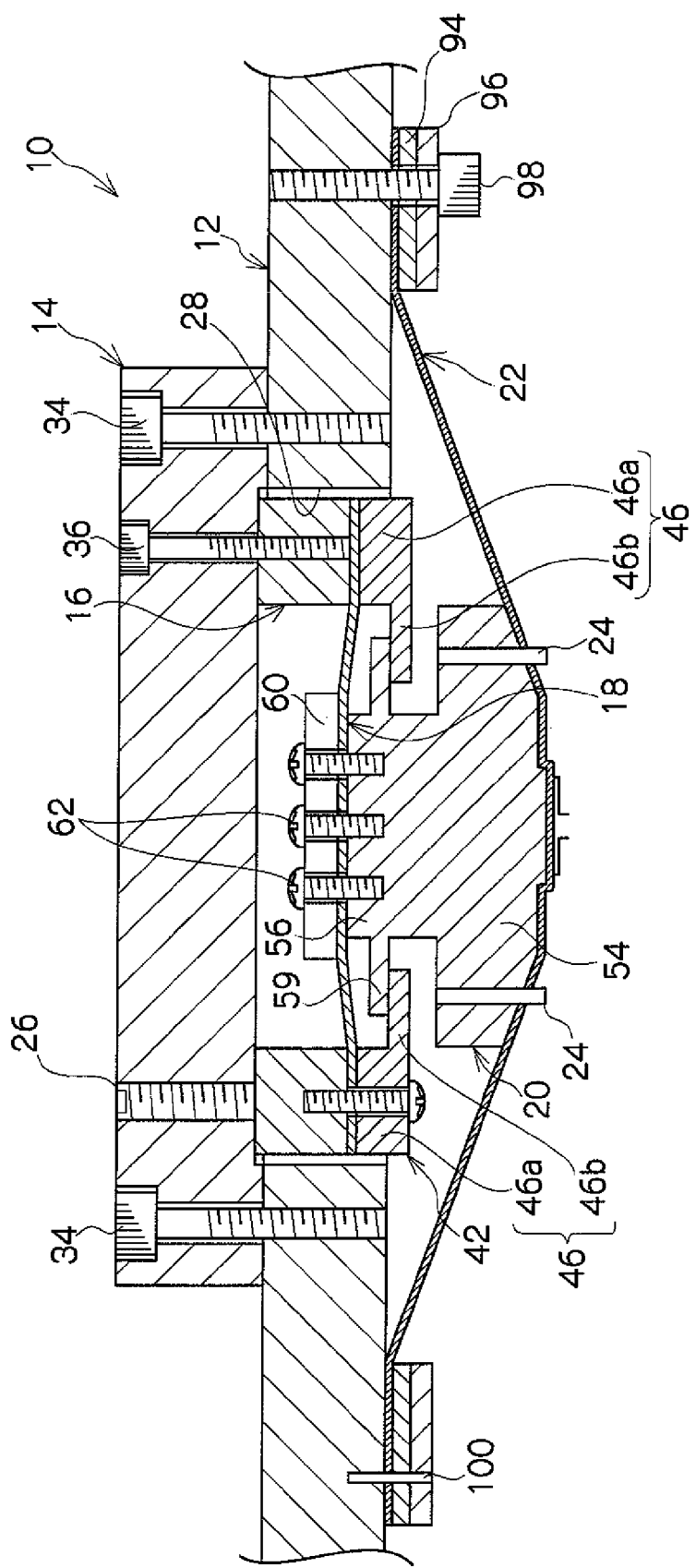
FIG. 3 is a cross-sectional view obtained along the line 3-3 in FIG. 2.
Figure 4:
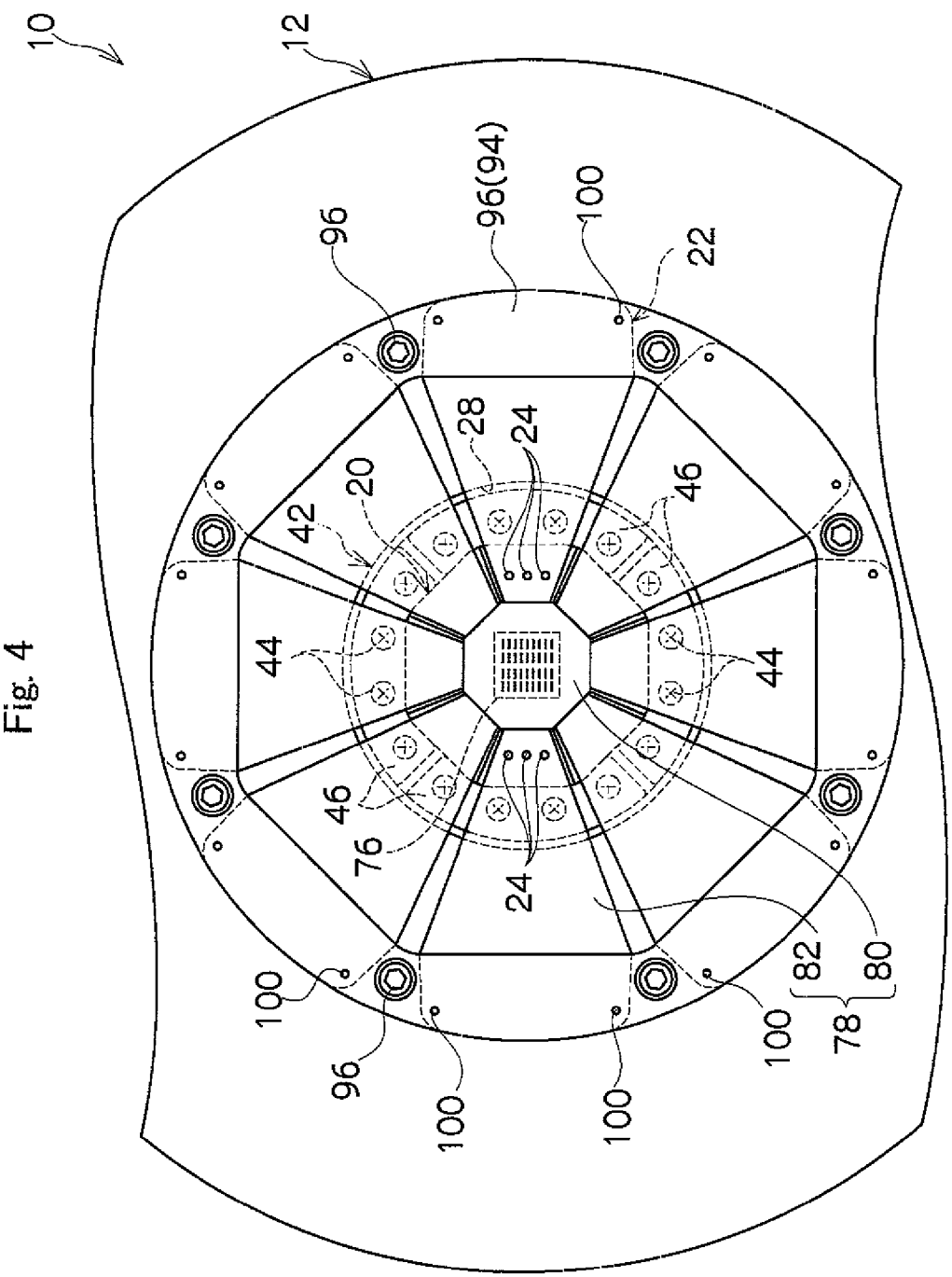
FIG. 4 is a bottom view of the electrical connecting apparatus shown in FIG. 1.
Figure 5:
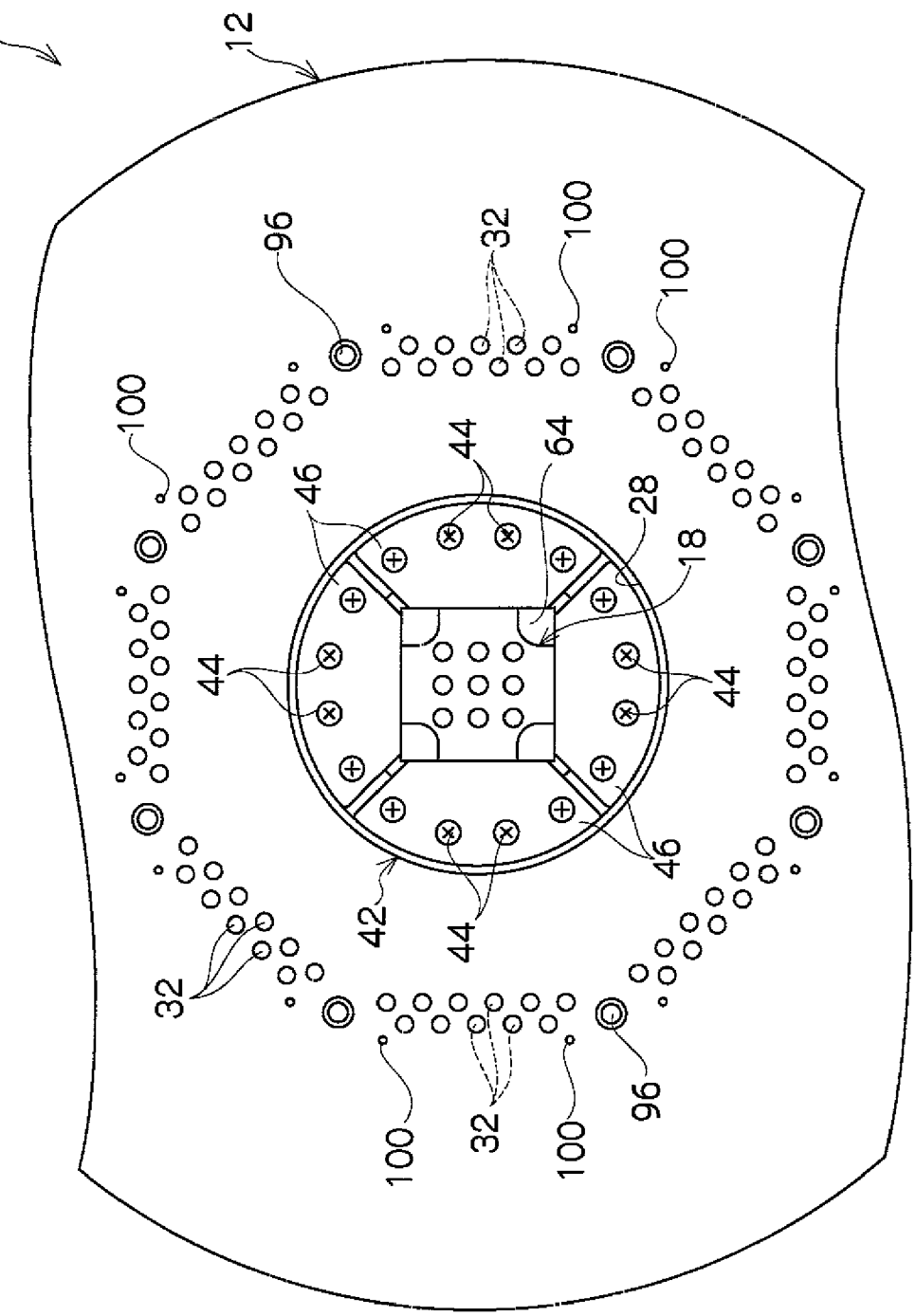
FIG. 5 is a bottom view of the electrical connecting apparatus shown in FIG. 1 in a state where a circuit board and a thrusting plate have been removed.

10: electrical connecting apparatus
12: support board
14: plate-shaped member
16: ring-shaped member
18: plate spring
20: block
22: circuit board
24: reference mark member
26: adjustment screw
28: through hole
30: tester land
32: connection land
34: screw member
36: attachment screw
38: center area of the plate spring
39: extending area of the plate spring
40: circumferential area of the plate spring
42: spring holder
44: screw member
46: holding piece
46: a arc portion forming an annular portion
46b: extending portion forming an inward flange portion
48: flat area
50: attachment surface of the block
51: intermediate surface of the block
52: slope of the block
54: lower block portion
56: attached surface of the block
58: upper block portion
59: outward flange portion
60: attachment plate
62: screw member
64: recess of the block
66: groove of the block
70: sheet
70a, 70b, 70c: sheet members
72: conductive path
74: contactor
76: contactor area of the circuit board
78: outside area of the circuit board
80: intermediate area of the circuit board
82: extending portion of the circuit board
84: connection bump
86: plate
88: pedestal portion of the contactor
88a, 88b: first and second seat portions
90: main body portion of the contactor
90a: arm portion
90b: probe tip portion
92: adhesive
94: rubber ring
96: thrusting ring
100: positioning pin
102: reference mark

DETAILED DESCRIPTION

In an embodiment of the present invention, in FIG. 1, the right-left direction is referred to as an X direction or a right-left direction, the front-back direction is referred to as a front-back direction or a Y direction, and the up-down direction is referred to as an up-down direction or a Z direction. However, these directions differ depending on the posture in which a device under test is arranged in a testing apparatus, that is, the posture of the device under test arranged in the testing apparatus.

Accordingly, as for the above directions, the X direction and the Y direction may be determined to be within any one plane of a horizontal plane, an inclined surface inclined to the horizontal plane, and a vertical plane vertical to the horizontal plane or may be determined to be a combination of these planes in accordance with an actual testing apparatus.

An embodiment of an electrical connecting apparatus 10 is used in an electrical test of a rectangular integrated circuit (not shown) in a similar manner as a probe card. The integrated circuit has a plurality of electrodes. These electrodes are arrayed in two lines to be spaced in the right-left direction (or the front-back direction) in the example of a test performed in the connecting apparatus shown in FIG. 9.

Referring to FIGS. 1 to 12, the electrical connecting apparatus 10 includes a disk-shaped support board 12, a plate-shaped member 14 attached to the upper surface of the support board 12, a plate-shaped ring-shaped member 16 arranged on the lower side of the plate-shaped member 14, a plate spring 18 arranged on the lower side of the ring-shaped member 16, a table or a block 20 attached to the lower surface of the plate spring 18, a film-shaped board or a circuit board 22 arranged on the lower side of the block 20, plural reference mark members 24 attached to the block 20, and a plurality of adjustment screws 26 (refer to FIGS. 2 and 3) penetrating the plate-shaped member 14 in its thickness direction and fitting to the aforementioned ring-shaped member 16.

The support board 12 has a through hole 28 passing through its center in the thickness direction (up-down direction), has at the circumferential portion on the upper surface a plurality of tester lands 30 (refer to FIG. 2) connected to a tester, and has on the lower surface in an area between the through hole 28 and the outer portion a plurality of connection lands 32 (refer to FIGS. 5 and 12) to be spaced in the circumferential direction. The through hole 28 has a circular flat plane shape.

The support board 12 also has inside a plurality of wires (conductive paths) respectively connecting the tester lands 30 and the connection lands 32 in one-to-one relationship. Such a support board 12 may be a wiring board made of epoxy resin containing glass or a ceramic material.

The plate-shaped member 14 is formed in a disk shape larger than the through hole 28 and is attached to the upper surface of the support board 12 by a plurality of screw members 34 penetrating the plate-shaped member 14 and screwed in the support board 12 in a state of blocking the through hole 28, that is, in parallel with the support board 12.

The plate-shaped member 14 is made of a metal material such as stainless steel so as to act as a reinforcing plate for the support board 12. Thus, the plate-shaped member 14 does not need to be a complete plate but may be one formed in a plate shape consisting of a flat center portion, a plurality of extending portions extending from this center portion in the radial direction of an imaginal circle to be spaced in the circumferential direction of the imaginal circle, and an outer portion connected to the tip ends of these extending portions and extending in the circumferential direction of the imaginal circle, as the plate spring 18 described later.

Figure 6:
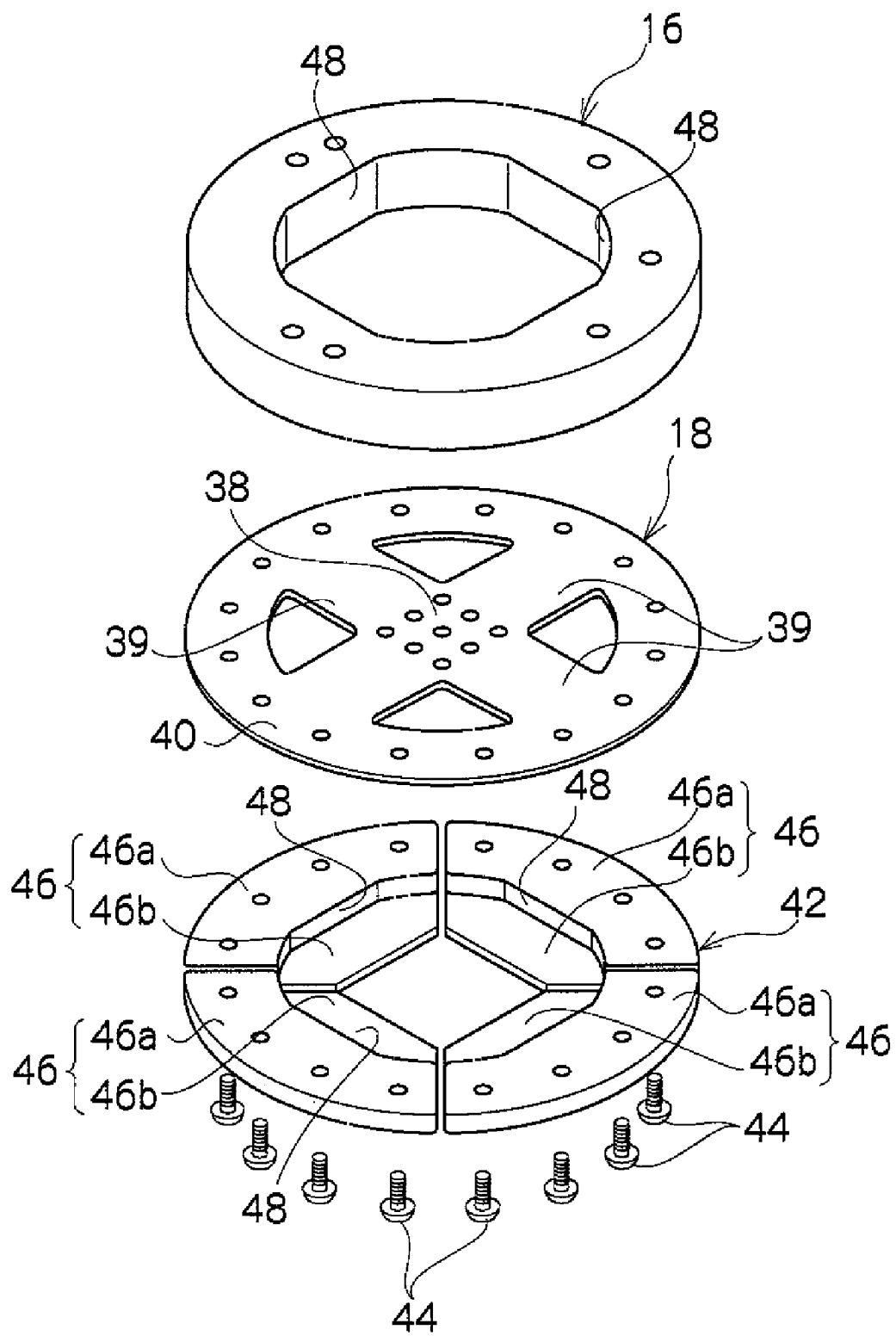
FIG. 6 is an exploded perspective view showing an embodiment of a ring-shaped member, a plate spring, and a spring holder.

As shown in FIG. 6, the ring-shaped member 16 is also formed in a plate-shaped ring shape made of a metal material such as stainless steel, especially a metal material having a small thermal expansion coefficient, and having a slightly smaller outer dimension than the diameter dimension of the through hole 28, and is located in the through hole 28 of the support board 12.

The ring-shaped member 16 is attached to the lower surface of the plate-shaped member 14 in parallel with the support board 12 and the plate-shaped member 14 by a plurality of attachment screws 36 penetrating the plate-shaped member 14 in its thickness direction and screwed in the ring-shaped member 16.

As shown in FIG. 6, the plate spring 18 has a flat center area 38, a plurality of plate-shaped extending areas 39 extending from the center area 38 in the radial direction of an imaginal circle to be spaced in the circumferential direction of the imaginal circle, and a ring-shaped circumferential area 40 integrally continuing around the extending areas 39.

The center area 38 and the extending areas 39 are formed in a star (*) shape. The number of the extending areas 39 may be an appropriate value such as four, six, eight, or the like. In the example shown in the figures, the number of the extending areas 39 is four, and thus the center area 38 and the extending areas 39 are in a cross shape crossing at the center area 38.

The plate spring 18 is made of a material selected from a group including tungsten, molybdenum, their alloy, and a ceramic material, having a smaller thermal expansion coefficient than that of stainless steel.

The plate spring 18 is attached at the circumferential area 40 to the lower surface of the ring-shaped member 16 by a spring holder 42 and a plurality of screw members 44 penetrating the plate spring 18 and the spring holder 42 from the lower side and screwed in the ring-shaped member 16.

Accordingly, the plate spring 18 is supported on the support board 12 via the plate-shaped member 14 in a stable state so as to close the through hole 28 of the support board 12 in a state of being sandwiched between the ring-shaped member 16 and the spring holder 42.

In the example shown in the figures, the spring holder 42 consists of a plurality of holding pieces 46. These holding pieces 46 are combined to one another so as to collaboratively form an annular portion screwed on the ring-shaped member 16 to bring a state of being thrust to the circumferential area 40 of the plate spring 18 and a rectangular (or circular) inward flange portion extending from the lower end portion of this annular portion to the center side of the annular portion.

Thus, each holding piece 46 has an arc portion 46a forming the aforementioned annular portion and an extending portion 46b forming the aforementioned flange portion in collaboration with the other holding pieces 46. However, the spring holder 42 may be formed by a ring-shaped single member or halved member having the aforementioned annular portion and the aforementioned flange portion.

Figure 11:
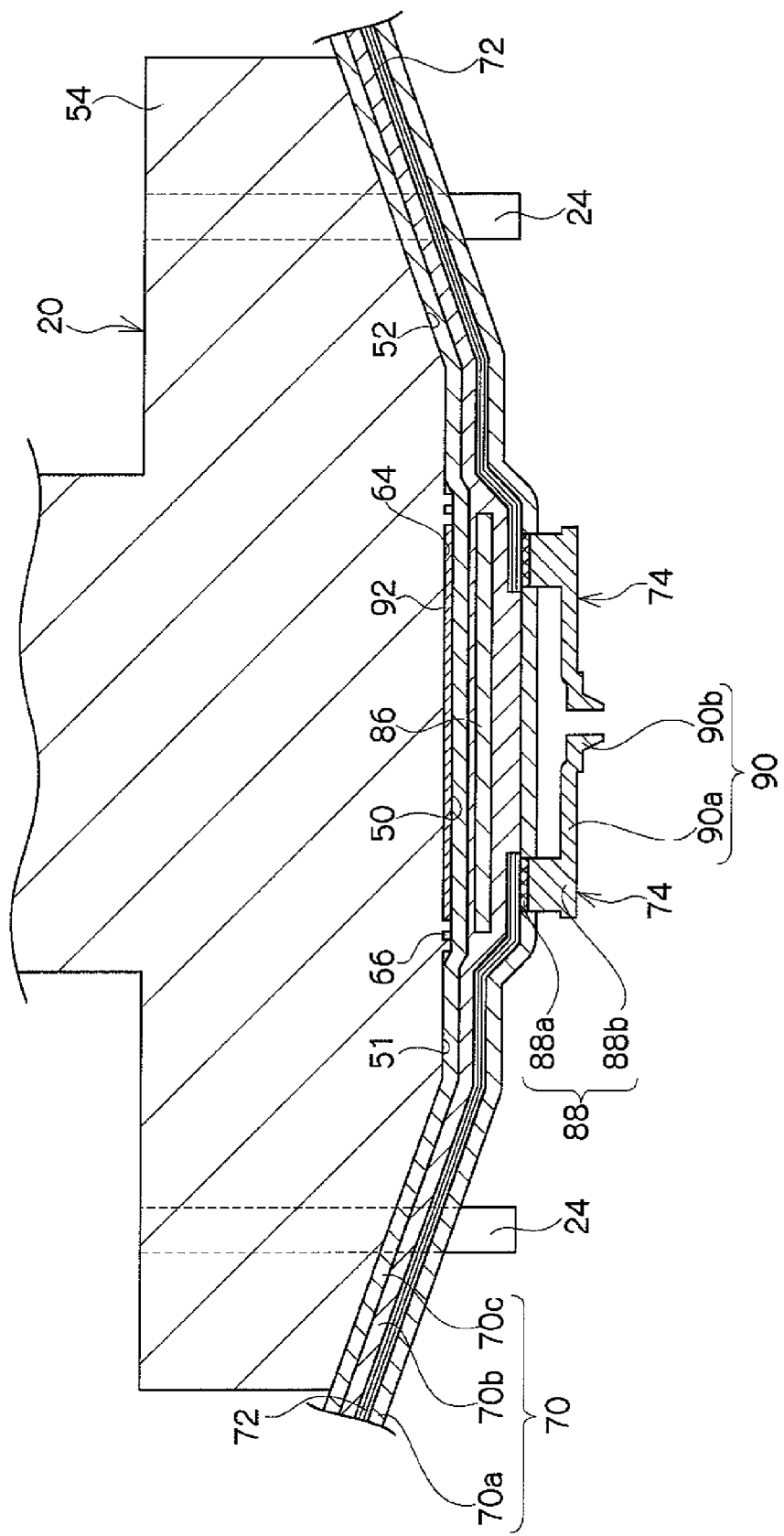
FIG. 11 is a cross-sectional view obtained along the line 11-11 in FIG. 9.

As shown in FIGS. 6 and 11, as for the inner surfaces of the ring-shaped member 16 and the annular portion of the spring holder 42, portions corresponding to the boundaries between the extending areas 39 and the circumferential area 40 of the plate spring 18 are a plurality of flat areas 48 extending in the tangential direction of the outer circumference surface of the plate spring 18 and in the up-down direction.

At least the plate-shaped member 14, the ring-shaped member 16, and the spring holder 42 act as an attachment device for attaching the plate spring 18 to the support board 12.

Figure 7:
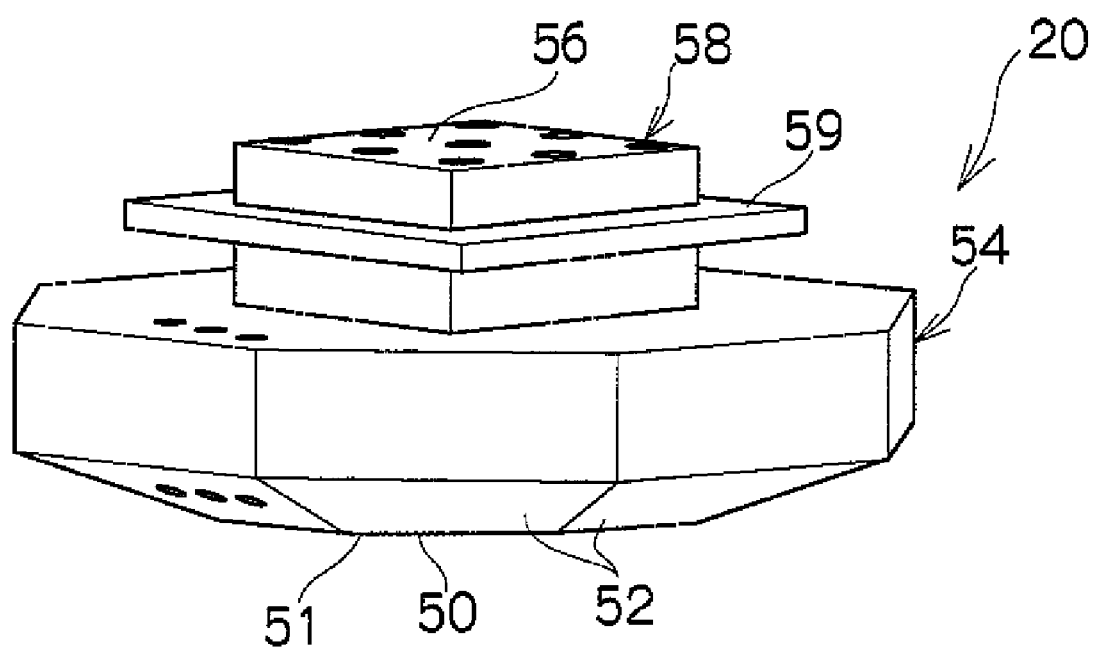
FIG. 7 is a perspective view showing an embodiment of a block.
Figure 8:
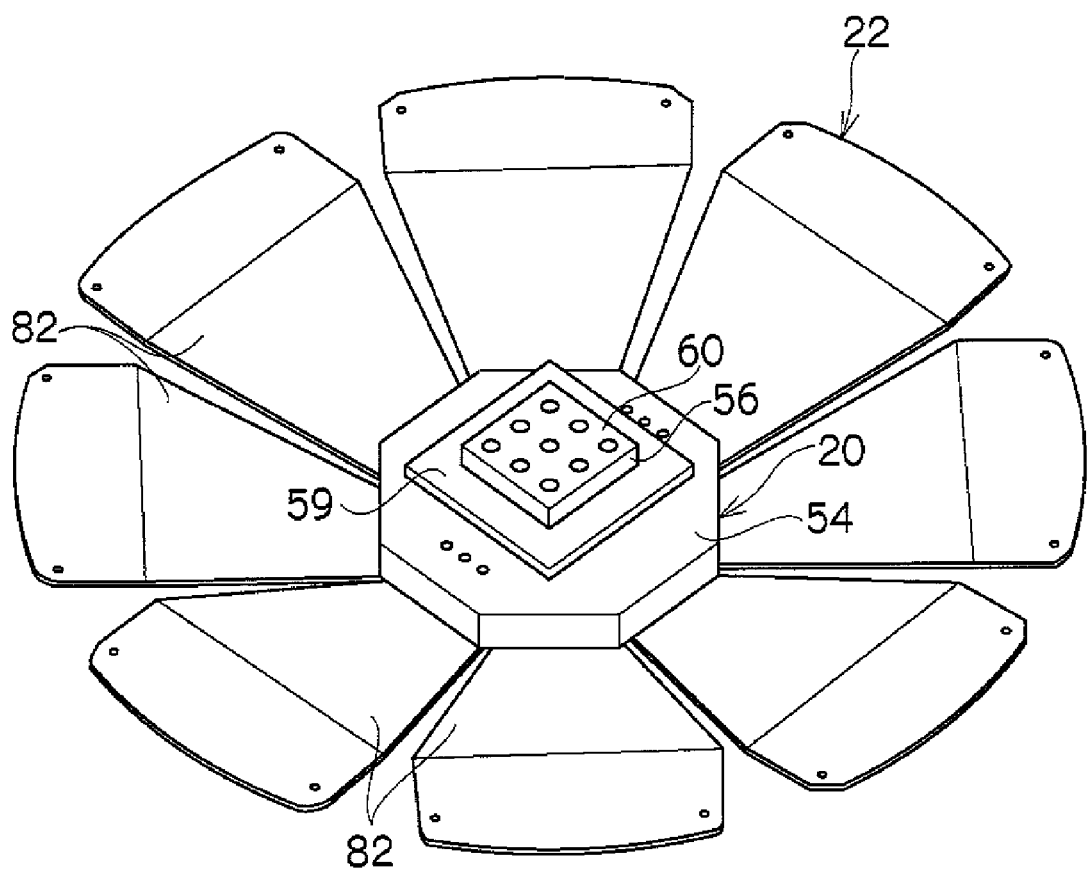
FIG. 8 is a perspective view showing a state where the circuit board has been attached to the block.

As shown in FIG. 7, the block 20 comprises a lower block portion 54 having a truncated polygonal pyramidal downward surface formed by an attachment surface 50 to which the circuit board 22 is to be attached, an intermediate surface 51 continuing into the perimeter of the attachment surface 50, and a plurality of slopes 52 continuing into the perimeter of the intermediate surface 51, a prismatic upper block portion 58 whose upper end surface is an attached surface 56 to the plate spring 18, and an outward flange portion 59 extending outward in the radial direction from the upper block portion 58.

In the example shown in the figures, the shape of the upper block 58 is a quadrangular prism, and the shape of the attached surface 56 is a quadrangle. Also, the attachment surface 50, the intermediate surface 51, and the attached surface 56 are parallel surfaces, and the downward surface of the lower block portion 54 is formed in a truncated octagonal pyramidal shape. The flange portion 59 is formed in a rectangular (or circular) shape opposed to the inward flange portion consisting of the extending portions 46b of the spring holder 42.

The block 20 is attached to the lower surface of the center area 38 of the plate spring 18 at the upper block portion 58 by a plurality of screw members 62 in a state where the center area 38 of the plate spring 18 is sandwiched between a rectangular attachment plate 60 and the upper block portion 58 and in a state where at least the attachment surface 50 is protruded in the downward direction of the support board 12. By doing so, the block 20 is kept in a state of being attached to the plate spring 18.

As shown in FIG. 11, as for the lower end portion of the lower block portion 54, the attachment surface 50 is slightly protruded downward more than the intermediate surface 51 around the attachment surface 50. At the lower end portion of the lower block portion 54 are formed a recess 64 opened at the attachment surface 50 and a downward groove 66 extending around the recess 64.

As shown in FIGS. 8 to 13, the circuit board 22 has an electrical insulating sheet 70 such as polyimide in which a plurality of stripped wires or conductive paths 72 is formed inside thereof, and a contactor 74 equipped to each conductive path 72. Thus, the circuit board 22 has flexibility. The sheet 70 is constituted by three sheet members 70a, 70b, and 70c.

The circuit board 22 has a rectangular contactor area 76 in which the contactors 74 are arranged and an outside area 78 around the contactor area 76. The outside area 78 comprises an intermediate area 80 integrally continuing into the perimeter of the contactor area 76 and a plurality of extending portions 82 extending from the intermediate area 80 in the radial direction of an imaginal circle centering around the contactor area 76 to be spaced around the intermediate area 80.

Each conductive path 72 extends from the inside of the contactor area 76 in which the contactors 74 are arranged to the outside area 78 outward in the radial direction of the aforementioned imaginal circle. At the outside end portion of each conductive path 72 is provided connection bumps 84 (refer to FIG. 12) penetrating the sheet members 70b and 70c and protruded upward. In the example shown in the figures, each conductive path 72 is in a three-layered structure of copper, nickel, and copper.

As shown in FIG. 11, a plate 86 is buried in a position corresponding to the contactor area 76 so as to maintain planarity of the contactor area 76. Accordingly, the contactor area 76 is protruded downward from the intermediate surface 51 as much as the sum of the thickness of the plate 86 and the amount of protrusion of the attachment surface 50 relative to the intermediate surface 51. The plate 86 is made of an appropriate material such as a ceramic plate, a stainless steel plate, or the like.

The sheet members 70a and 70b cooperatively sandwich the conductive paths 72 there between, and the sheet members 70b and 70c cooperatively envelop the plate 86 therein.

The above sheet 70, conductive paths 72, and plate 86 may be manufactured with use of a photolithographic technique, an electroplating technique, a resin application technique, an electroforming technique, etc. by forming a plurality of conductive paths 72 on one surface of the sheet member 70a, subsequently forming the sheet member 70b on a conductive paths 72 side of the sheet member 70a, arranging the plate 86 on a position of the sheet member 70b corresponding to the contactor area 76, and forming the sheet member 70c on a plate side of the sheet member 70b.

Each contactor 74 includes a pedestal portion 88 joined to a corresponding conductive path 72 and protruded in the downward direction of the sheet member 70a and a main body portion 90 integrally continuing into the lower end of the pedestal portion 88.

The pedestal portion 88 comprises a first seat portion 88a made of a metal material of the same kind (e.g., copper) as that of the junction portion of the corresponding conductive path 72 and a second seat portion 88b joined to the lower end of the first seat portion 88a.

The first seat portion 88a is joined to the corresponding conductive path 72 at its upper end surface. The second seat portion 88b is made of the same metal material (e.g., nickel) as the main body portion 90 integrally with the main body portion 90 and is joined to the first seat body portion 88a.

The main body portion 90 comprises an arm portion 90a extending horizontally from the lower end of the second seat portion 88b and a probe tip portion 90b protruded downward from the tip end of the arm portion 90a.

The above contactor 74 may be manufactured with use of a photolithographic technique, an electroplating technique, an electroforming technique, etc. by sequentially forming the first seat portion 88a, the second seat portion 88b, the arm portion 90a, and the probe tip portion 90b in this order or reverse order.

After a part of the sheet member 70a is removed, the contactor 74 manufactured as above is joined to the corresponding conductive path 72 at the upper end surface of the first seat portion 88a by conductive adhesive. Thus, each contactor 74 is supported on the sheet 70 in a cantilevered manner in a state where the main body portion 90 is distanced downward from the sheet 70.

However, the sheet 70, the conductive paths 72, and the contactors 74 may be manufactured consecutively with use of a photolithographic technique, an electroplating technique, a resin application technique, an electroforming technique, etc. By doing so as well, each contactor is supported on the sheet 70 in a cantilevered manner.

In the above case, they may be manufactured in order of the probe tip portions 90b, the arm portions 90a, the second seat portions 88b, the sheet member 70a, the first seat portions 88a, the conductive paths 72, the sheet member 70b, and the sheet member 70c. The plate 86 is arranged on the sheet member 70b prior to formation of the sheet member 70c.

If the circuit board 22 is manufactured as above, the respective coupling strengths between the conductive path 72 and the first seat portion 88a, between the first seat portion 88a and the second seat portion 88b, between the second seat portion 88b and the arm portion 90a, and between the arm portion 90a and the probe tip portion 90b are increased.

Also, when the first seat portion 88a is the same metal material as the junction portion of the conductive path 72, and the second seat portion 88b is the same metal material as the main body portion 90, the coupling strengths between the first seat portion 88a and the conductive path 72 and between the second seat portion 88b and the main body portion 90 are further increased.

The junction surface between the first and second seat portions 88a and 88b is within the sheet member 70a as shown in FIG. 11. Accordingly, since the junction surface between both the seat portions 88a and 88b is closed in the sheet member 70a, even when a bending moment acts on the pedestal portion 88, separation of the first and second seat portions 88a and 88b caused by the bending moment is prevented.

As shown in FIG. 11, the circuit board 22 is bonded to the attachment surface 50 at least contactor area 76 by adhesive 92 stored in the recess 64 in a state where the contactor area 76 and the intermediate area 80 are opposed to the attachment surface 50, and where part of each extending portion 82 is opposed to each slope 52.

The contactor area 76 and the intermediate area 80 around it are respectively thrust to the attachment surface 50 and the intermediate surface 51 around it at the time of being bonded to the block 20. Thus, since excessive adhesive in the recess 64 is pushed out to an area around the contactor area 76 (at least part of the intermediate area 80), the circuit board 22 is bonded to an area around the attachment surface 50 (at least part of the intermediate surface 51) at the area around the contactor area 76 as well. As a result, the circuit board 22 is maintained in a state where the contactor area 76 is protruded further downward than a portion around it.

When the contactor area 76 and the area around it are bonded to the attachment surface 50 and the area around it as above, the contactor area 76 and the area around it are supported on the block 20 in a stable manner, and thus the contactors 74 are stable against the support board 12.

Figure 12:
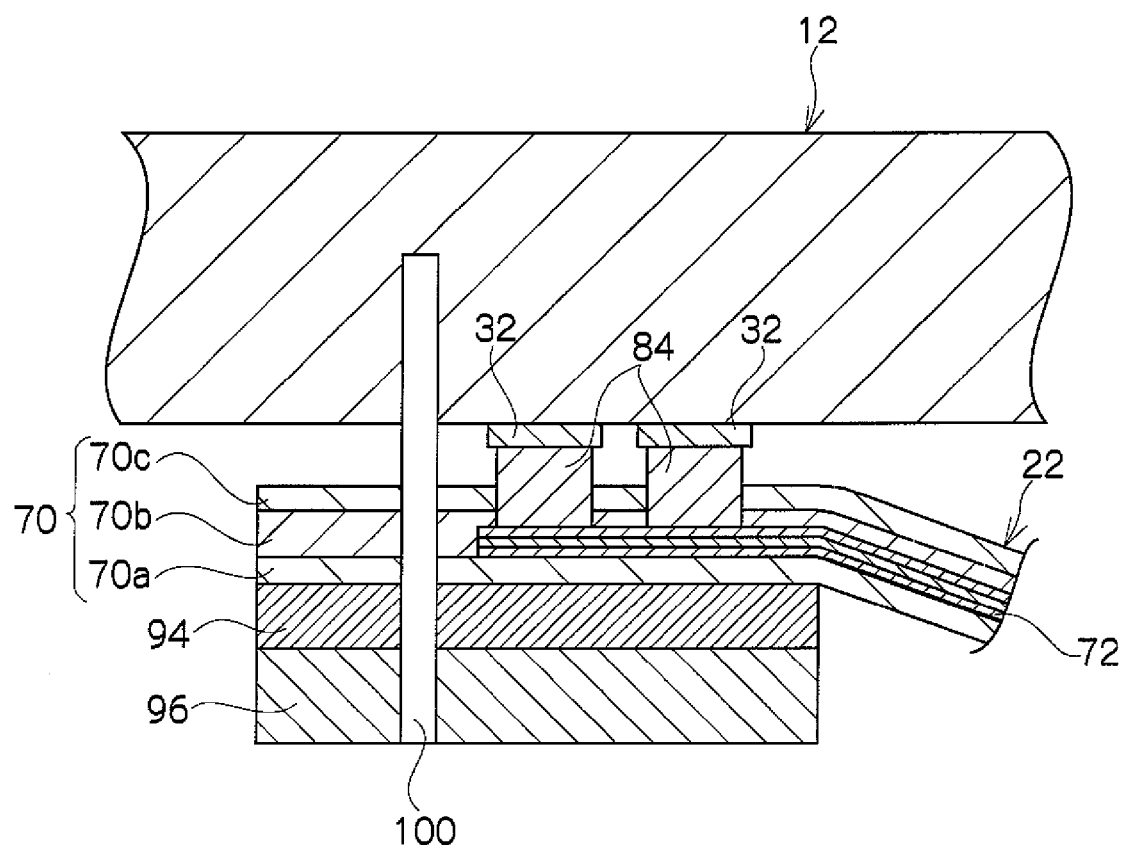
FIG. 12 is an enlarged cross-sectional view showing an attachment state of the circuit board to a support board.

The circuit board 22 is also attached at the tip ends of the extending portions 82 to the lower surface of the support board 12 by an elastic plate-shaped rubber ring 94 such as a silicone rubber, a plate-shaped thrusting ring 96 having certain hardness such as stainless steel, and a plurality of screw members 98 in a state where the connection bumps 84 are thrust to the connection lands 32 as shown in FIG. 12.

Positioning of the circuit board 22 against the support board 12 is performed by a plurality of positioning pins 100 extending downward from the support board 12 and penetrating the extending portions 82 of the circuit board 22, the rubber ring 94, and the thrusting ring 96 to be protruded downward. Each positioning pin is held in the support board 12 in a stable manner.

In a state where the circuit board 22 is attached to the block 20 and the support board 12 as above, each contactor 74 is aligned so that its probe tip 90b is opposed to a corresponding electrode of a device under test and is electrically connected to the tester land 30 of the support board 12 via the conductive path 72, the connection bumps 84, the connection lands 32, the wires in the support board 12, etc.

Each reference mark member 24 is a pin member protruded downward from the slope 52 of the lower block portion 54 and is supported in the lower block portion 54 at its upper portion in a stable manner. In the example shown in the figures, three pairs of reference mark members 24 are provided. The reference mark members 24 of each pair are opposed to each other with the contactor area 76 and the intermediate area 80 in between.

The lower end surface of each reference mark member 24 is a surface parallel to the attachment surface 50, and the height position of the lower end surface of each reference mark member 24 is set back further upward than the height position of the contactors 74.

The lower portion of each reference mark member 24 is protruded in the downward direction of the circuit board 22 at the extending portion 82 of the circuit board 22, passing between the adjacent conductive paths 72. Since the pitch of the adjacent conductive paths 72 at the extending portion 82 is wider than that at the intermediate area 80, the reference mark member 24 does not influence the formation position of the conductive paths 72.

Figure 9:
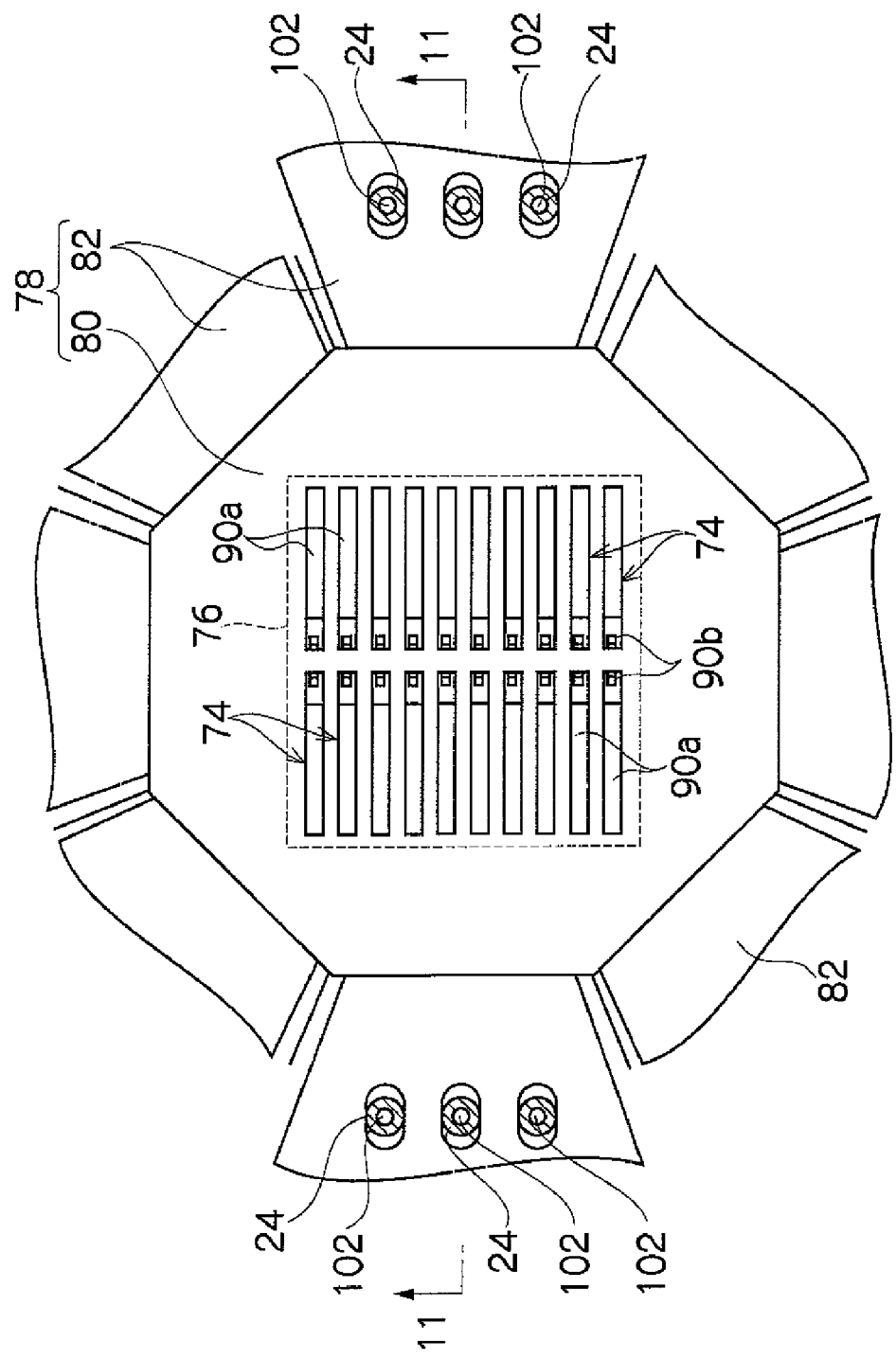
FIG. 9 is an enlarged bottom view of the contactor area of the circuit board and its perimeter.
Figure 10:
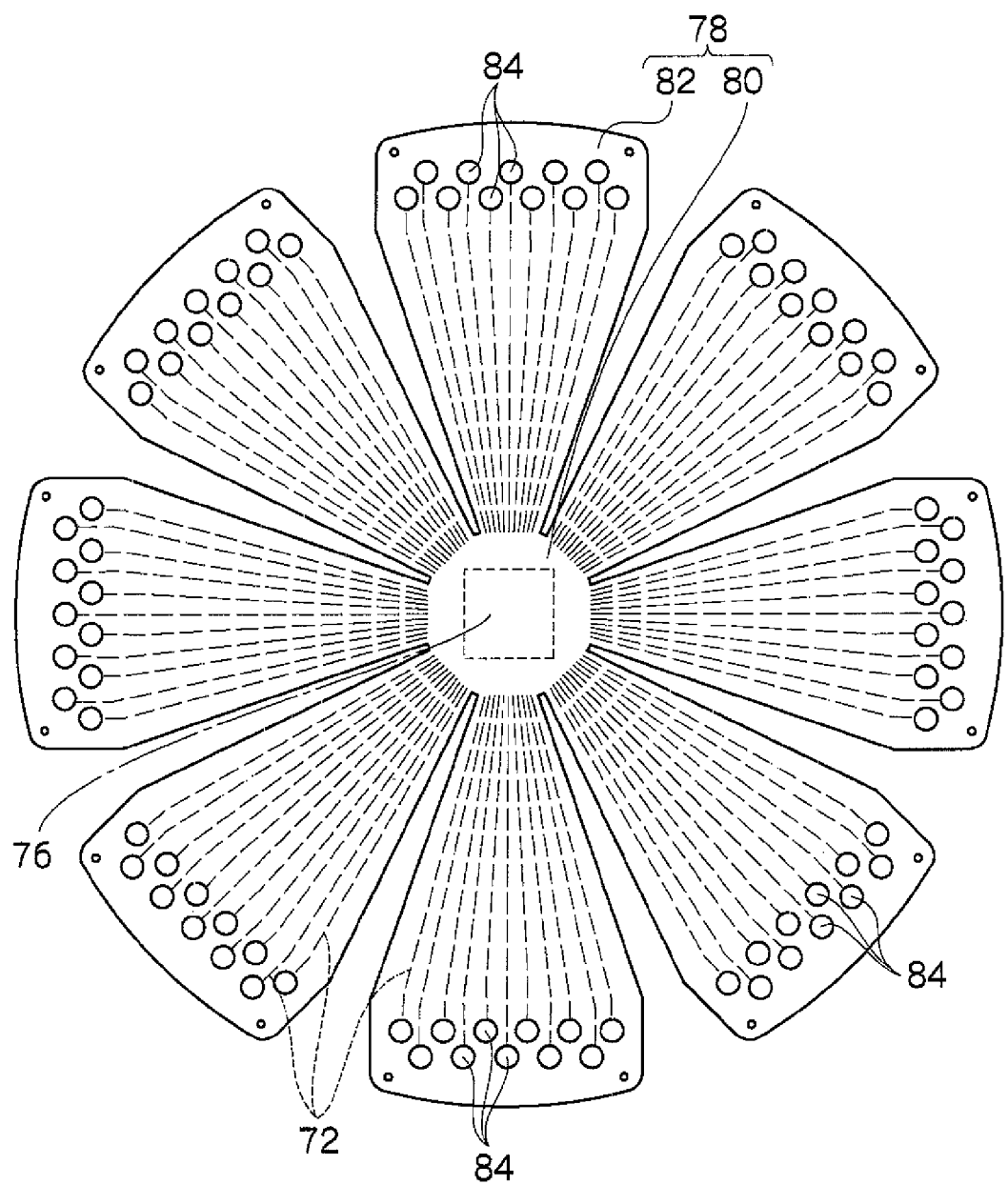
FIG. 10 is a plan view showing an embodiment of the circuit board.

As shown in FIG. 9, each reference mark member 24 has a reference mark 102 on the lower end surface. Each reference mark 102 cooperates with a reference mark 102 of an opposed reference mark member 24 with the contactor area 76 in between to represent the positions of the tip ends of the probe tip portions 90b or the probe tips located between both the reference marks 102 in the electrical connecting apparatus 10.

Each reference mark 102 has different optical characteristics from those of the periphery. Although the reference mark 102 is a round mark at the center in the example shown in the figures, it may be a dot, a crosshair intersection, etc.

Each reference mark 102 may be formed by forming a mark layer on the lower surface of the reference mark member 24 in advance by an appropriate technique such as electroplating or paint application, after completion of the electrical connecting apparatus 10, measuring the positions of the probe tip portions 90a, and removing by laser beam corresponding positions in the mark layer based on the measurement result. By doing so, the reference mark 102 may be formed accurately without depending on the assembling accuracy of the electrical connecting apparatus 10.

The block 20, the reference mark members 24, the spring holder 42, the attachment plate 60, and the positioning pins 100 are made of appropriate materials, for example electrical insulating metal materials.

Figure 13:
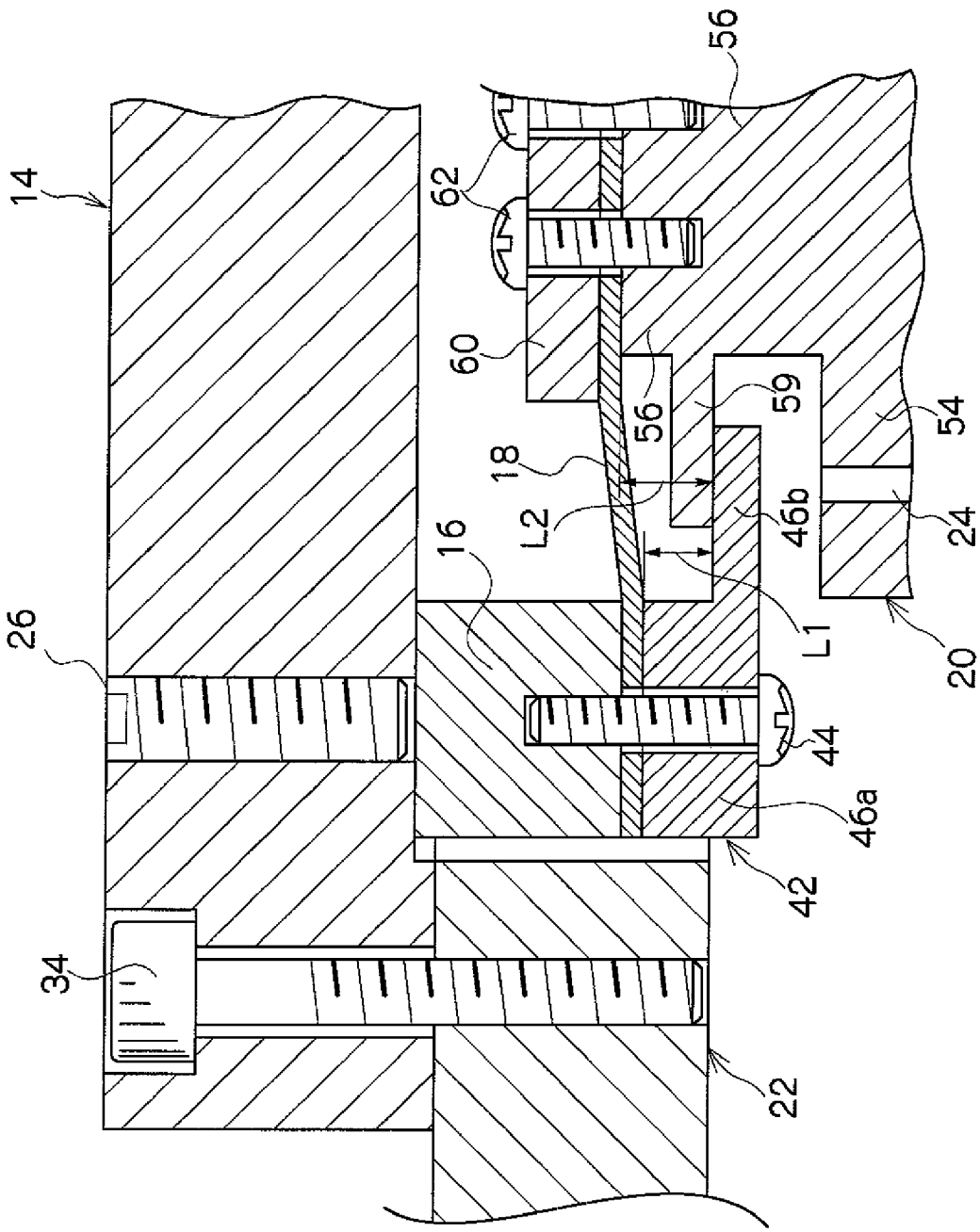
FIG. 13 is an enlarged cross-sectional view showing a joining relationship between a flange portion of the block and a flange portion of the spring holder.

As shown in FIG. 13, the distance dimension L1 from the upper end of the annular portion formed by the arc portions 46a of the spring holder 42 to the upper end of the inward flange portion formed by the extending portions 46b is shorter than the distance dimension L2 from the upper end of the upper block portion 56 to the lower end of the outward flange portion 59. Also, in a state where the block 20 is attached to the plate spring 18, the flange portion 59 is located on the upper side of the inward flange portion.

As a result of the above, the plate spring 18 receives initial load to bring a state where at least the center area 38 is biased toward the upper side of the support board 12 and is elastically deformed by the preload.

In a state where the electrical connecting apparatus 10 is assembled as above, planarity of the contactor area 76 against the support board 12 is adjusted.

This planarity adjustment may be performed by adjusting the screwing amount of the adjustment screws 26 in the plate-shaped member 14 in a state that the contactor area 76 is parallel to the support board such that the screwing amount of the attachment screws 36 in the ring-shaped member 16 is small and thereafter screwing the attachment screws 36 in the ring-shaped member 16 to reach a state where the adjustment screws 26 abut to the upper surface of the ring-shaped member 16. Accordingly, planarity of the contactor area 76 against the support board 12 may be adjusted easily.

Since the contactor area 76 is bonded to the attachment surface 50, it is reliably displaced against the support board 12 in conformity with the block 20 at the time of the aforementioned planarity adjustment.

The electrical connecting apparatus 10 is incorporated in the testing apparatus in a state where the contactor area 76 is above the arrangement area of the device under test, and where the probe tip portion 90b of each contactor 74 is opposed to an electrode of the device under test, and the tester lands 30 of the support board 12 are connected to electrical circuits for an electrical test. In this manner, each contactor 74 is electrically connected to the electrical circuits for the electrical test.

In the electrical connecting apparatus 10, the reference marks 102 are measured for positioning of the probe tips of the contactors 74 against the testing apparatus in a state where the electrical connecting apparatus 10 is mounted in the testing apparatus.

At the time of this measurement, since the reference marks 102 are formed on the lower end surfaces of the reference mark members 24 other than the contactors 74, the probe tip positions may be measured highly accurately and reliably regardless of whether or not foreign matters remain on the probe tip portions 90b and without being influenced by optical characteristics in the vicinity of the reference marks 102.

As for the reference marks 102, the reference marks 102 of at least one pair of reference mark members 24 whose lower end surfaces are distanced with the contactor area 76 in between only need to be measured. Accordingly, the two-dimensional positions of the contactors 74 on the coordinates in the testing apparatus may be measured accurately.

However, if the reference marks 102 of the three pairs of reference mark members 24 whose lower end surfaces are distanced with the contactor area 76 in between are measured, the two-dimensional positions of the contactors 74 on the coordinates in the testing apparatus may be measured more accurately.

At the time of the electrical test, the electrical connecting apparatus 10 and the device under test are moved relatively in directions in which they approach to each other. By doing so, the probe tip 90b of each contactor 74 is thrust to a corresponding electrode of the device under test, and overdriving acts on the contactor 74.

When the probe tip 90b of each contactor 74 is thrust to the electrode of the device under test, the cantilevered contactor 74 is elastically deformed slightly in an arc shape at the arm portion 90a, and the plate spring 18 is elastically deformed due to the overdriving.

At this time, since the plate spring 18 receives initial load to bring a state where at least the center area 38 is biased toward the upper surface side of the support board 12 and is elastically deformed by the preload, the probe pressure acting on the probe tip of each contactor 74 and the electrode of the device under test comes under the influence of not only reactive force by elastic deformation of the contactor 74 and the plate spring 18 when the probe tip is thrust to the electrode of the device under test but also reactive force based on elastic deformation of the plate spring 18 by the initial load. Accordingly, a good electrical contacting state may be obtained without increasing the overdriving amount.

Also, since the center area 38 of the plate spring 18 is integrally connected to the circumferential area 40 by the extending areas 39, the plate spring 18 is elastically deformed at the extending areas 39 reliably when the probe tips of the contactors 74 are thrust to the electrodes of the device under test. Consequently, irregular flexure of the plate spring 18 is prevented reliably.

Further, since the outward flange portion 59 of the block 20 is located on the upper side of the inward flange portion 46b of the spring holder 42, the plate spring 18 is kept in a state of receiving the initial load without preventing displacement of the block 20 in the up-down direction when the probe tips of the contactors 74 are thrust to the electrodes of the device under test.

When the overdriving acts on the contactor 74, the electrical connecting apparatus 10 takes the following technical merits.

Since the contactor area 76, the intermediate area 80, and part of each extending portion 82 of the circuit board 22 are opposed to the attachment surface 50, the intermediate surface 51, and part of each slope 52 of the block 20, respectively, and moreover the height position of the lower end surface of each reference mark member 24 is higher than the height position of the contactors 74, the reference mark member 24 does not contact the device under test when the probe tips 90b are thrust to the electrodes of the device under test.

When the contactors 74 are thrust to the electrodes, the plate spring 18 acts as a reaction force body for the center area of the circuit board 22, which is the arrangement area of the contactors 74. Consequently, the plate spring 18 is elastically deformed slightly by the circuit board 22 and the block 20 and allows the contactor area 76 to be displaced upward in parallel by the overdriving. This leads to a uniform thrusting force of the contactors 74 to the electrodes.

The block 20 reliably transmits the deformation of the contactor area 76 of the circuit board 22 to the plate spring 18, and the through hole 28 allows the plate spring 18 to be elastically deformed easily to the ring-shaped member 16 side. This stabilizes the elastic deformation of the plate spring 18 and the circuit board 22 and leads to easier contact of each contactor 74 with, the electrode.

Irregular flexibility of the plate spring 18 when the overdriving acts on the contactors 74 is reliably prevented by the fact that the block 20 is attached to the star-shaped or cross-shaped intersection of the plate spring 18 and the fact that the inner surfaces of the ring-shaped member 16 and the spring holder 42 have the flat areas 48 and 48 extending in the tangential direction of the outer circumference surface of the plate spring 18 and in the up-down direction at the respective portions corresponding to the boundaries between the center area 38 and the circumferential area 40 of the plate spring 18, and the thrusting force of the contactors 74 to the electrodes is more uniform.

Since the coupling portion between both the seat portions 88a and 88b is located within the sheet 70, that is, the coupling portion is located within the thickness dimension of the sheet 70, a part of the bending moment acting on the pedestal portion 88 is received in the sheet 70, and the coupling portion is protected by the sheet 70. As a result, separation of the contactor 74 from the sheet 70 caused by the overdriving is prevented while the coupling force between the conductive path 72 and the pedestal portion 88 is large.

The pedestal portion 88 distances the main body portion 90, particularly the tip end of the contactor 74, from the sheet 70 significantly. Accordingly, the main body portion 90 is hard to come into contact with the sheet 70, and the sheet 70 is hard to contact the device under test by the overdriving, as a result of which the contactor 74 reliably contacts the electrode of the device under test.

When the plate spring 18 made of a material having a smaller thermal expansion coefficient than that of stainless steel is used, thermal expansion and contraction of the plate spring 18 and displacement of the probe tip positions in reaction to heating or cooling of the device under test are small. Consequently, breakage of the probe tips and contact failure of the probe tips to the electrodes of the device under test are prevented.

The spring constant of the plate spring 18 may be smaller than the total sum of the spring constant of all the contactors 74. By doing so, as variation of the probe pressure per contactor is shown in FIG. 14, when the overdriving acts on the contactors 74, only the contactors 74 are elastically deformed until the overdriving amount is one (approximately 10 micrometers) in which the initial load by the preload acted on the plate spring 18 and the total sum of the spring constant of all the contactors 74 are at equilibrium, and thereafter the plate spring 18 is elastically deformed mainly although the contactors 74 are also elastically deformed.

As a result of the above, the probe pressure acting between the probe tips of the contactors 74 and the electrodes of the device under test increases significantly in reaction to the overdriving in a state where only the contactors 74 are elastically deformed (in a state of the initial load) and thereafter increases moderately. Thus, variation of the probe pressure by the overdriving is small, and stable electrical contact may be obtained.

Figure 14:
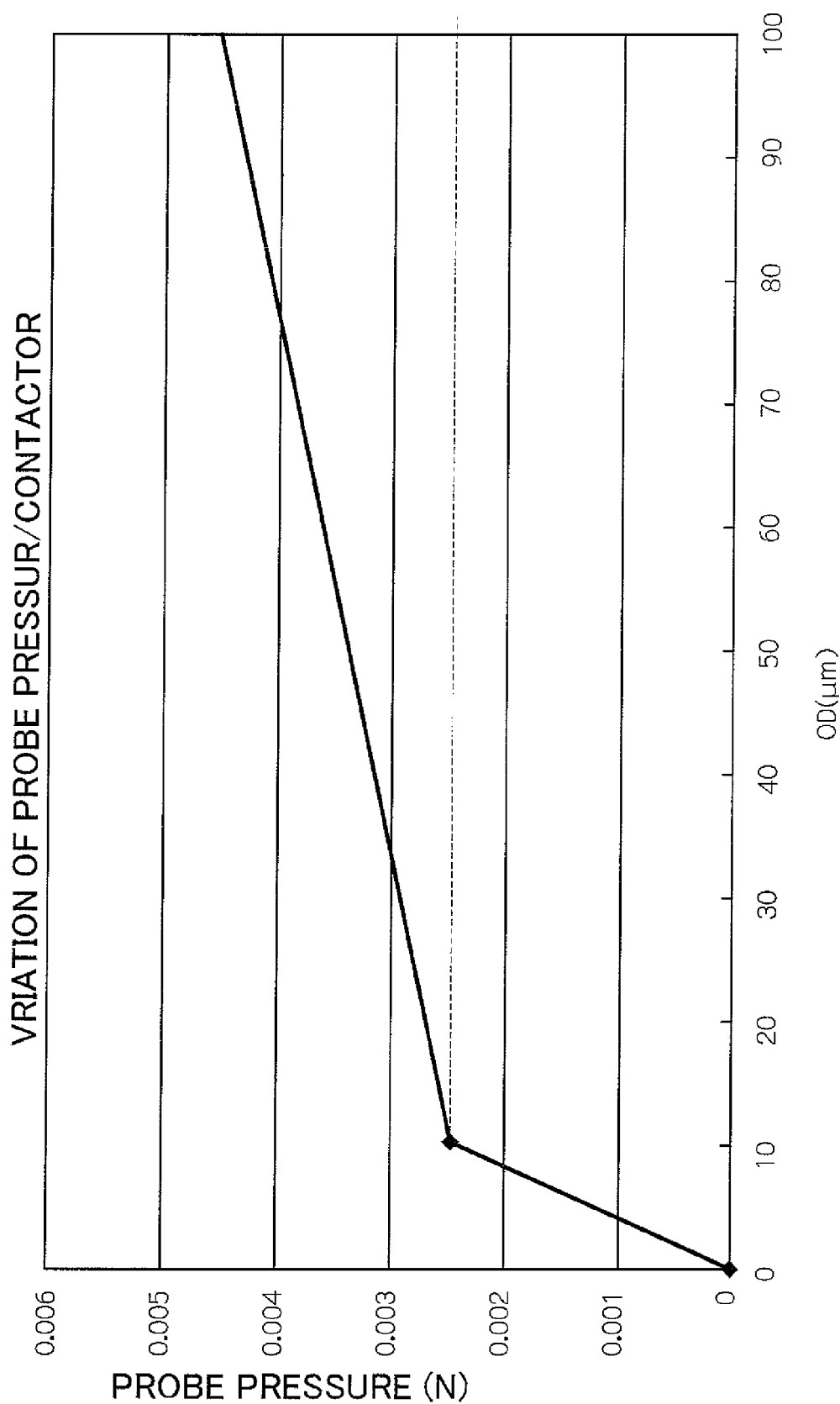
FIG. 14 shows variation of the probe pressure per contactor when overdriving acts on the contactor.

In the variation of the probe pressure shown in FIG. 14, the plate spring 18 is a molybdenum plate having a thickness of 0.1 mm and having spring constant of about 3.8 N/mm, 1550 contactors 74 have been used, the total sum of the spring constant of the contactors 74 is about 380 N/mm, and initial load (preload) of 3.8 N/mm has been applied to the plate spring 18, in which state overdriving OD has acted on each contactor 74.

In a case where the mechanical strength of the support board 12 is high, the plate-shaped member 14 may not be provided. Also, the plate spring 18 may be attached to the support board 12 so as to be opposed to the through hole 28. Further, instead of providing the plate spring 18 in the through hole 28, the ring-shaped member 16 may be attached to the lower surface of the support board 12, and the plate-shaped member 14 and the through hole 28 may be omitted.

The present disclosure is not limited to the above embodiments but may be altered in various ways without departing from the spirit and scope of the present invention.

What is claimed is:

1. An electrical connecting apparatus comprising:
   a support board having an upper surface and a lower surface;
   a plate spring arranged on said support board;
   an attachment device for attaching said plate spring to said support board;
   a block having an attachment surface directed downward and attached to the lower side of said plate spring in a state where at least said attaching surface is protruded further to the lower side than said support board; and a flexible circuit board having a contactor area in which a plurality of contactors are arranged and an outside area around said contactor area and attached at part of said outside area to the lower surface of said support board in a state where at least said contactor area is opposed to said attachment surface of said block, wherein said plate spring has a center area to which said block is attached, a plurality of extending areas integrally continuing to said center area and extending from said center area in the radial direction of an imaginary circle to be spaced in the circumferential direction of the imaginary circle, and a circumferential area integrally continuing to said extending area and supported on said attachment device, and receives initial load to bring a state where at least said center area is biased toward the upper side of said support board.

2. The electrical connecting apparatus according to claim 1, wherein said attachment device has a ring-shaped member arranged on said support board so that at least its part is opposed to part of said plate spring, and a spring holder attached to said ring-shaped member so as to sandwich part of said plate spring in collaboration with said ring-shaped member.

3. The electrical connecting apparatus according to claim 2, wherein said spring holder has an annular portion screwed on said ring-shaped member so as to sandwich a part of said plate spring in collaboration with said ring-shaped member and an inward flange portion extending from the lower end portion of said annular portion to the center side of said annular portion, and wherein said block has a lower block portion having said attachment surface, an upper block portion protruded upward from said lower block portion and attached to said plate spring, and an outward flange portion extending outward in the radial direction from said upper block portion and located on the upper side of said inward flange portion.

4. The electrical connecting apparatus according to claim 3, wherein the distance dimension from the upper end of said annular portion to the upper end of said inward flange portion is shorter than the distance dimension from the upper end of said upper block portion to the lower end of said outward flange portion.

5. The electrical connecting apparatus according to claim 3, wherein said attachment device further has an attachment plate attached to the upper side of said upper block portion via said plate spring so as to sandwich said center area of said plate spring in collaboration with said upper block portion.

6. The electrical connecting apparatus according to claim 2, wherein said support board has a through hole at the center, and wherein said plate spring is attached to said support board so as to be located within said through hole or to be opposed to said through hole.

7. The electrical connecting apparatus according to claim 6, wherein said attachment device further has a plate-shaped member attached to the upper side of said support board so as to close said through hole, and said ring-shaped member is attached to the lower side of said plate-shaped member.

8. The electrical connecting apparatus according to claim 1, further comprising a thrusting ring for attaching said outside area of said circuit board to the lower surface of said support board.

9. The electrical connecting apparatus according to claim 1, wherein the spring constant of said plate spring is smaller than the total sum of the spring constant of said contactors.

* * * * *